US009291905B2

(12) United States Patent
Kumagai et al.

(10) Patent No.: US 9,291,905 B2
(45) Date of Patent: Mar. 22, 2016

(54) DEVELOPING SOLUTION FOR PHOTOLITHOGRAPHY, METHOD FOR FORMING RESIST PATTERN, AND METHOD AND APPARATUS FOR PRODUCING DEVELOPING SOLUTION FOR PHOTOLITHOGRAPHY

(71) Applicant: Tokyo Ohka Kogyo Co., Ltd., Kanagawa (JP)

(72) Inventors: Tomoya Kumagai, Kawasaki (JP); Naohisa Ueno, Kawasaki (JP); Jun Koshiyama, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/626,383

(22) Filed: Feb. 19, 2015

(65) Prior Publication Data

US 2015/0160560 A1    Jun. 11, 2015

Related U.S. Application Data

(62) Division of application No. 12/970,803, filed on Dec. 16, 2010.

(30) Foreign Application Priority Data

| Dec. 25, 2009 | (JP) | 2009-296434 |
| Dec. 25, 2009 | (JP) | 2009-296435 |
| Feb. 16, 2010 | (JP) | 2010-031397 |
| Oct. 26, 2010 | (JP) | 2010-240037 |

(51) Int. Cl.
*G03F 7/32* (2006.01)
*B01F 3/08* (2006.01)
(Continued)

(52) U.S. Cl.
CPC ............... *G03F 7/322* (2013.01); *B01F 3/088* (2013.01); *B01F 3/20* (2013.01); *B01F 3/2078* (2013.01);
(Continued)

(58) Field of Classification Search
CPC ...................................................... G03F 7/322
USPC ............................................................ 430/434
See application file for complete search history.

(56) References Cited

U.S. PATENT DOCUMENTS

| 4,423,138 A | 12/1983 | Guild |
| 5,879,851 A | 3/1999 | Takahashi et al. |

(Continued)

FOREIGN PATENT DOCUMENTS

| CA | 1 176 901 | 10/1984 |
| EP | 0 089 249 | 1/1982 |

(Continued)

OTHER PUBLICATIONS

Santillan et al. "Alternative Developer Solutions for EUV Resists", Semiconductor Leading Edge Technologies, Inc. (Selete), 70th Technical Meeting of The Japan Society of Applied Physics, Lecture Proceeding No. 2, p. 635 (2009).

(Continued)

*Primary Examiner* — Chanceity Robinson
(74) *Attorney, Agent, or Firm* — Knobbe, Martens, Olson & Bear LLP

(57) ABSTRACT

A developing solution for photolithography in which tetrabutylammonium hydroxide (TBAH) is used as an alkaline agent of the developing solution and deposition of TBAH is suppressed. A method for producing a developing solution for photolithography capable of suppressing TBAH deposition when producing the developing solution by diluting a concentrated developing solution containing TBAH and a production apparatus used for the production method. The developing solution includes tetrabutylammonium hydroxide and at least one of a water-soluble organic solvent, a surfactant, and a clathrate compound. The temperature of the liquid is maintained at 27° C. or higher during dilution.

7 Claims, 2 Drawing Sheets

(51) Int. Cl.
  *B01F 3/20* (2006.01)
  *B01F 7/18* (2006.01)
  *B01F 15/00* (2006.01)

(52) U.S. Cl.
  CPC ............. *B01F 7/18* (2013.01); *B01F 15/00175* (2013.01); *B01F 15/00207* (2013.01); *B01F 15/00396* (2013.01)

(56) References Cited

U.S. PATENT DOCUMENTS

| | | | |
|---|---|---|---|
| 6,187,519 B1 | 2/2001 | Sugawara | |
| 6,403,289 B1 * | 6/2002 | Tanaka et al. | 430/329 |
| 2002/0137219 A1 | 9/2002 | Owens et al. | |
| 2006/0128581 A1 | 6/2006 | Sawada et al. | |
| 2007/0003883 A1 * | 1/2007 | Sato | 430/434 |
| 2007/0069176 A1 * | 3/2007 | Kato | 252/79.1 |
| 2010/0086880 A1 | 4/2010 | Saito et al. | |

FOREIGN PATENT DOCUMENTS

| | | | |
|---|---|---|---|
| JP | S58-150949 A | | 9/1983 |
| JP | 62-119225 | * | 5/1987 |
| JP | H08-220774 | | 8/1996 |
| JP | 2670211 B | | 2/1999 |
| JP | H11-218932 A | | 8/1999 |
| JP | 2002-278084 | | 9/2002 |
| WO | WO 2005/022267 | | 10/2005 |

OTHER PUBLICATIONS

Notice of Reasons for Rejection in Japanese Patent Application No. 2009-296434, mailed Oct. 8, 2013.
Notice of Reasons for Rejection mailed Apr. 22, 2014 in Japanese Application No. 2010-240037.

* cited by examiner

DEVELOPING SOLUTION FOR PHOTOLITHOGRAPHY, METHOD FOR FORMING RESIST PATTERN, AND METHOD AND APPARATUS FOR PRODUCING DEVELOPING SOLUTION FOR PHOTOLITHOGRAPHY

This application is a divisional of U.S. patent application Ser. No. 12/970,803, filed Dec. 16, 2010, which claims priority to Japanese Patent Application Nos. 2009-296434, 2009-296435, 2010-031397 and 2010-240037, filed Dec. 25, 2009, Dec. 25, 2009, Feb. 16, 2010, and Oct. 26, 2010, respectively, the contents of which are incorporated herein by reference.

BACKGROUND OF THE INVENTION

1. Field of the Invention

The present invention relates to a developing solution for photolithography, a method for forming a resist pattern, and a method and an apparatus for producing a developing solution for photolithography.

2. Related Art

Recently, patterns are rapidly becoming finer due to advancement in photolithography technology to produce semiconductor elements or liquid crystal display elements. The fine patterns are achieved by miniaturizing resist patterns formed on surfaces of substrates etc. The resist patterns are prepared by forming a resist film of a resist composition containing a photosensitive compound on a surface of a substrate etc., selectively exposing the resist film with an active energy beam such as light and electron beams through a predetermined mask pattern, and performing a development processing. In this stage, a portion corresponding to a figure provided in the mask pattern becomes a resist pattern within the resist film. Then a semiconductor element is produced through a step of processing the substrate by etching using the resist pattern as a mask, for example. The resist compositions of which exposed portions become soluble in a developing solution are referred to as positive type and the resist compositions of which exposed portions become insoluble in a developing solution are referred to as negative type.

In the development processing of semiconductor element production processes, an alkaline aqueous solution of tetramethylammonium hydroxide (TMAH) is commonly used as the developing solution. TMAH is favorably used in the production of semiconductor elements since it does not contain metal ions affecting semiconductor elements. However, when integration degree of semiconductor elements is increased and the half pitch (HP) size becomes as small as 49 nm or less, a swelling phenomenon in which TMAH swells resist patterns during development is troublesome. When resist patterns are swelled by TMAH, there arises a factor to degrade reproducibility of patters so that the resist patterns degrade linearity or turn over during rinsing procedure after development.

Because of this, non-Patent Document 1 proposes to use an aqueous solution of tetrabutylammonium hydroxide (TBAH) rather than the aqueous solution of TMAH as the developing solution. The swelling phenomenon of resist patterns during development is mitigated and the reproducibility of patterns is improved by using the aqueous solution of TBAH as the developing solution.

In addition, the developing solution may be prepared in a way that the developing solution is shipped out in a concentrated condition from a manufacturer of the developing solution and the concentrated developing solution is diluted with pure water by a user to prepare the developing solution of a predetermined concentration (e.g., see Patent Document 1). The method described above is preferred from the viewpoint of reducing transportation cost of the developing solution.

Patent Document 1 Japanese Patent No. 2670211

Non-Patent Document 1 The Japan Society of Applied Physics, 70th Meeting, Extended Abstracts No. 2, p. 635, "Investigation of New Developing Solution for EUV Resist", Semiconductor Advanced Technologies, Juliusjoseph Santillan, by Toshiro Itani

SUMMARY OF THE INVENTION

Incidentally, TBAH is less soluble in water than TMAH which has been used heretofore in the developing solution. Therefore, in the case of containing TBAH in the developing solution, TBAH in the developing solution may deposit when the concentrated developing solution is transported or the concentrated developing solution is diluted. The TBAH deposited in the developing solution is not easily solved again unless warmed or the like. It is therefore impossible to use directly the developing solution containing the deposited TBAH in a development step and a labor hour of filter treatment or the like is necessary. If the deposited TBAH is removed by filtration, it is also troublesome such that concentration control of the developing solution is complicated since the concentration of TBAH in the developing solution changes.

The present invention has been made in view of the problems described above; and it is an object of the present invention to provide a developing solution for photolithography in which tetrabutylammonium hydroxide (TBAH) is used as an alkaline agent of the developing solution and deposition of TBAH is suppressed. It is another object of the present invention to provide a developing solution for photolithography in which tetrabutylammonium hydroxide (TBAH) is used as an alkaline agent of the developing solution and deposition of TBAH is suppressed in a concentrated condition. It is still another object of the present invention to provide a method for producing a developing solution for photolithography, a developing solution for photolithography, a method for forming a resist pattern, and a production apparatus used for the production method in which deposition of tetrabutylammonium hydroxide (TBAH) can be suppressed when a developing solution of a desired TBAH concentration is produced by diluting a concentrated developing solution containing TBAH with pure water.

The present inventors have thoroughly investigated to solve the problems described above, and as a result have found that the deposition of TBAH in the developing solution can be suppressed by adding at least one component selected from the group consisting of a water-soluble organic solvent, a surfactant, and a clathrate compound to the developing solution containing TBAH.

The present inventors have also researched in detail the relation between concentration and deposition temperature of TBAH in an aqueous solution of tetrabutylammonium hydroxide (TBAH). Consequently, it has become clear that the deposition temperature of TBAH exhibits a maximum value of 27° C. when the concentration of TBAH is 25% to 40% by mass and the deposition temperature of TBAH is lower than 27° C. when the concentration of TBAH is more or less than the range. That is, the aqueous solution of TBAH having a concentration range of TBAH of 25% to 40% by mass is most likely to deposit TBAH, and the TBAH deposition is observed in this concentration range when the aqueous solution temperature is below 27° C. The developing solution containing TBAH is typically a TBAH aqueous solution of 6.79% by mass although this depends on the developing condition, and its concentrated developing solution is typically a TBAH aqueous solution of 50% by mass or more. Therefore, when the developing solution is prepared by diluting the concentrated developing solution, the condition of TBAH concentration of 25% to 40% by mass where the deposition is most likely to appear certainly passes through. That is, the case that liquid temperature of the developing solution comes to below 27° C. during dilution results in TBAH deposition. In other words, if the liquid temperature during dilution can be always maintained at 27° C. or higher, the TBAH deposition can be suppressed.

The present inventors have experienced the fact described above, thereby completing the present invention.

In a first aspect of the present invention, a developing solution for photolithography includes tetrabutylammonium hydroxide (A), and at least one selected from the group consisting of a water-soluble organic solvent (B1), a surfactant (B2), and a clathrate compound (B3).

In a second aspect of the present invention, a method for forming a resist pattern uses the developing solution for photolithography of the first aspect.

In a third aspect of the present invention, a concentrated developing solution for photolithography includes tetrabutylammonium hydroxide (A), and at least one selected from the group consisting of a water-soluble organic solvent (B1), a surfactant (B2), and a clathrate compound (B3), in which the component (A) is 10% by mass or more.

In a forth aspect of the present invention, a method for producing a developing solution for photolithography includes mixing a tetrabutylammonium hydroxide aqueous solution of a first concentration and pure water in a mixing part to prepare an aqueous solution containing tetrabutylammonium hydroxide of a second concentration less than the first concentration, in which the temperature of the tetrabutylammonium hydroxide aqueous solution fed to the mixing part and the temperature of the pure water are 27° C. or higher and the temperature of the liquid mixed in the mixing part is maintained at 27° C. or higher.

In a fifth aspect of the present invention, a developing solution for photolithography is provided which is produced by the method of producing a developing solution for photolithography of the forth aspect.

In a sixth aspect of the present invention, a method for forming a resist pattern uses the developing solution for photolithography of the fifth aspect.

In a seventh aspect of the present invention, an apparatus for producing a developing solution for photolithography includes a mixing part which is equipped with a stirring means, a first feed pipe to feed a tetrabutylammonium hydroxide aqueous solution of a first concentration, and a second feed pipe to feed pure water; a first warming means which warms the tetrabutylammonium hydroxide aqueous solution fed from the first feed pipe into the mixing part to 27° C. or higher; a second warming means which warms the pure water fed from the second feed pipe into the mixing part to 27° C. or higher; and a temperature control means for maintaining the temperature of the liquid in the mixing part at 27° C. or higher when the tetrabutylammonium hydroxide aqueous solution of the first concentration fed from the first feed pipe into the mixing part and the pure water fed from the second feed pipe into the mixing part are mixed by the stirring means to prepare a developing solution for photolithography containing tetrabutylammonium hydroxide of a second concentration less than the first concentration.

In accordance with the present invention, firstly, a developing solution for photolithography is provided in which tetrabutylammonium hydroxide (TBAH) is used as an alkaline agent of the developing solution and deposition of TBAH is suppressed. In accordance with the present invention, secondly, a developing solution for photolithography is provided in which tetrabutylammonium hydroxide (TBAH) is used as an alkaline agent of the developing solution and deposition of TBAH is suppressed in a concentrated condition. In accordance with the present invention, thirdly, a method for producing a developing solution for photolithography, a developing solution for photolithography, a method for forming a resist pattern, and a production apparatus used for the production method are provided in which deposition of tetrabutylammonium hydroxide (TBAH) can be suppressed when a developing solution of a desired TBAH concentration is produced by diluting a concentrated developing solution containing TBAH with pure water.

DETAILED DESCRIPTION OF THE INVENTION

Figure 1:
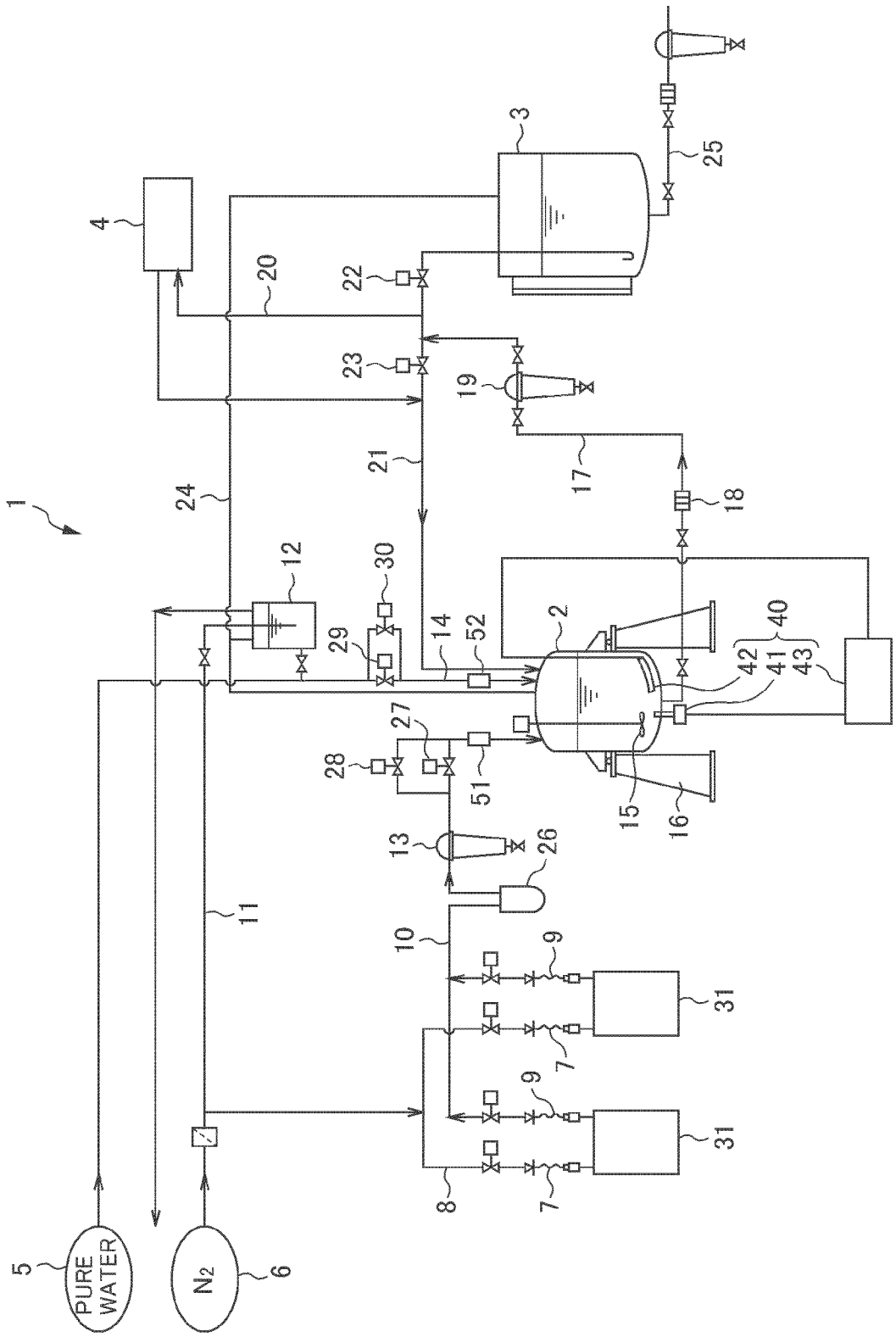
FIG. 1 is a schematic configuration view which shows an apparatus for producing a developing solution for photolithography used in one embodiment of a production method of the present invention.

The developing solution for photolithography of the present invention is explained below. The developing solution for photolithography of the present invention is used in a development processing to solve and remove alkali-soluble portions from a resist film after selectively exposing a film of a resist composition containing a photosensitive compound with an active energy beam such as light and electron beams. The resist film turns into a resist pattern with a predetermined pattern configuration through such a processing. In this connection, the developing solution of the present invention is favorably used for forming ultrafine resist patterns for forming fine semiconductor elements having a half pitch (HP) size of 49 nm or less where swelling of resist patterns is troublesome and also may be used for forming semiconductor elements having larger half pitch sizes or those other than semiconductor elements such as color filters for liquid crystal displays.

The developing solution for photolithography of the present invention includes tetrabutylammonium hydroxide (A), and at least one selected from the group consisting of a water-soluble organic solvent (B1), a surfactant (B2), and a clathrate compound (B3). The components (B1), (B2), and (B3) (hereinafter, collectively referred to as "solubilizing component (B)" or "component (B)") are used for assisting dissolution of the component (A) into water. These components are explained below.

Tetrabutylammonium Hydroxide (A)

The tetrabutylammonium hydroxide (TBAH) used as the component (A) in the developing solution of the present invention imparts an alkaline liquid property necessary to develop a resist film after exposure processing to the developing solution. In the case of a positive-type resist film which is alkali-insoluble under unexposed condition, exposed portions become alkali-soluble, and in the case of a negative-type resist film which is alkali-soluble under unexposed condition, exposed portions become alkali-insoluble. Therefore, the alkali-insoluble portions remain as a resist pattern by the processing with an alkaline developing solution after exposure. The component (A) is added to the developing solution in order to impart the alkaline liquid property necessary for the processing to the developing solution.

As described above, tetramethylammonium hydroxide (TMAH) is usually used in order to impart the alkaline liquid property to the developing solution; however, TMAH has a property to slightly swell resist patterns. The swelling behavior of TMAH on resist patterns has been scarcely troublesome for forming patterns having a half pitch size of 50 nm or more, however, the swelling behavior sometimes causes a problem to degrade linearity of resist patterns or to turn over patterns when forming patterns having a half pitch size of less than 50 nm. Therefore, TBAH (component (A)) with a swelling property less than that of TMAH on resist patterns is used as the compound to impart the alkaline liquid property to the developing solution in the present invention.

The content of the component (A) in the developing solution is preferably 0.1% to 20% by mass. When the content of the component (A) in the developing solution is 0.1% by mass or more, an appropriate development property can be imparted to the developing solution. Furthermore, when the content of the component (A) in the developing solution is 20% by mass or less, the deposition inhibition suppression effect on the component (A) due to the component (B) described later can be obtained. The content of the component (A) in the developing solution is more preferably 1% to 10% by mass and most preferably 3% to 7% by mass. In addition, when TMAH is used in the developing solution as an alkaline component, the content of TMAH is typically 2.38% by mass. The content of the component (A) may be 6.79% by mass from the viewpoint that the mole concentration at this amount is equal to the mole concentration of TMAH.

Furthermore, the developing solution of the present invention may be in a concentrated condition during being transported or reserved and may be diluted to the concentration described above with a solvent when used as the developing solution. The developing solution in a concentrated condition also falls within the scope of the developing solution of the present invention. The content of the component (A) in the concentrated condition is not particularly limited and may be appropriately decided considering the content of the component (A) in use as the developing solution; the content is preferably 10% to 60% by mass and more preferably 20% to 50% by mass, for example. In addition, the concentration of the components (B) is expressed by the concentration in use as the developing solution.

Solubilizing Component (B)

A solubilizing component is added to the developing solution of the present invention as the component (B). The component (B) is at least one selected from the group consisting of a water-soluble organic solvent (B1), a surfactant (B2), and a clathrate compound (B3). In other words, the component (B) is one or more components selected from the group consisting of a water-soluble organic solvent (B1), a surfactant (B2), and a clathrate compound (B3). The solubility of the component (A) is increased by adding the component (B) to the developing solution and thus the deposition temperature of the component (A) can be lowered in the developing solution. The deposition of the component (A) in the developing solution is suppressed by lowering the deposition temperature of the component (A) and thus stability of the developing solution is enhanced. When the developing solution is in a concentrated condition in particular (higher concentration of TBAH), TBAH is likely to deposit under low temperature environment, therefore, it is preferred that the deposition temperature of TBAH is lowered by adding the component (B). The components added as the component (B) are explained below.

Water-Soluble Organic Solvent (B1)

The solubility of the component (A) in the developing solution can be enhanced by adding the water-soluble organic solvent (component (B1)) to the developing solution as the component (B) and thus the deposition of the component (A) in the developing solution can be suppressed. The effect is pronounced when the developing solution is in the concentrated condition in particular.

The component (B1), which is not particularly limited as long as it is less harmful to photoresist films, is exemplified by alcohols including monovalent alcohols such as methanol, ethanol, n-propanol, isopropanol, n-butanol, isobutanol, sec-butanol, tert-butanol, n-amyl alcohol, isoamyl alcohol, sec-amyl alcohol, and tert-amyl alcohol, and polyhydric alcohols such as ethylene glycol, propylene glycol, butanediol, 1,5-pentanediol, 1,6-hexanediol, 1,2-hexanediol, 2,4-hexanediol, hexylene glycol, 1,7-heptanediol, octylene glycol, glycerin, and 1,2,6-hexanetriol; ethers such as diisopropyl ether, diisobutyl ether, diisopentyl ether, di-n-butyl ether, di-n-pentyl ether, di-sec-butyl ether, diisopentyl ether, di-sec-pentyl ether, and di-tert-amyl ether; and glycol ethers such as ethylene glycol monomethyl ether, ethylene glycol monoethyl ether, ethylene glycol monobutyl ether, diethylene glycol monomethyl ether, diethylene glycol monoethyl ether, diethylene glycol monopropyl ether, and diethylene glycol monobutyl ether. Among these, alcohols including dihydric alcohols such as ethylene glycol and propylene glycol, trihydric alcohols such as glycerin, and monohydric alcohols such as isopropanol, n-butanol, isobutanol, and sec-butanol are preferably exemplified from the viewpoint that dissolution and swelling of resist patterns are suppressed during development and solubility of TBAH is sufficiently enhanced; among others, dihydric alcohols and trihydric alcohols are more preferably exemplified. The component (B1) described above may be used alone or in combination of two or more.

The content of the component (B1) in the developing solution is preferably 1% to 10% by mass. When the content of the component (B1) in the developing solution is 1% by mass or more, the deposition of the component (A) in the developing solution is effectively suppressed. The effect is pronounced when the developing solution is in the concentrated condition. Furthermore, when the content of the component (B1) is 10% by mass or less, the influence of the component (B1) on resist patterns such as dissolution and swelling can be reduced. The content of the component (B1) in the developing solution is more preferably 3% to 10% by mass and still more preferably 3% to 7% by mass. In addition, the content of the component (B1) in this connection refers to the concentration in the developing solution in actual use for development processing rather than the concentration in the developing solution in the concentrated condition, as described above.

Surfactant (B2)

The solubility of the component (A) in the developing solution can be increased and the deposition of the component (A) in the developing solution can be suppressed by adding the surfactant (component (B2)) as the component (B) to the developing solution. The effect is pronounced when the developing solution is in the concentrated condition. Furthermore, when the component (B2) is added to the developing solution, wettability of the developing solution is enhanced, resulting in the effect to suppress development residues, scums, etc.

The component (B2) is not particularly limited and may be conventional surfactants. Specifically, nonionic surfactants, anionic surfactants, cationic surfactants, and ampholytic surfactants may be used.

The anionic surfactant is not particularly limited and may be conventional surfactants having an anionic group. The anionic surfactant may be exemplified by those having carboxylic acid group, sulfonic acid group, or phosphoric acid group as the anionic group.

Specifically, higher fatty acids, higher alkyl sulfuric acid esters, higher alkyl sulfonic acids, higher alkyl aryl sulfonic acids having an alkyl group of 8 to 20 carbon atoms, other surfactants having a sulfonic acid group, higher alcohol phosphoric acid esters, salts of these compounds, or the like may be exemplified. Here, the alkyl group of the anionic surfactants may be linear or branched; phenylene group, oxygen atom, etc. may intervene in their branched chains; and a part of hydrogen atoms in their alkyl groups may be substituted by hydroxyl group or carboxyl group.

Specific examples of the higher fatty acids include dodecanoic acid, tetradecanoic acid, stearic acid, etc.; and specific examples of the higher alkyl sulfuric acid esters may be decyl sulfuric acid ester, dodecyl sulfuric acid ester, etc. Examples of the higher alkyl sulfonic acids include decane sulfonic acid, dodecane sulfonic acid, tetradecane sulfonic acid, pentadecane sulfonic acid, stearic acid sulfonic acid, etc.

Specific examples of the higher alkyl aryl sulfonic acids include dodecylbenzene sulfonic acid, decylnaphthalene sulfonic acid, etc.

Furthermore, examples of the other surfactants having a sulfonic acid group include alkyldiphenyl ether disulfonic acids such as dodecyl diphenyl ether disulfonic acid, dialkyl sulfosuccinates such as dioctyl sulfosuccinate, etc.

Examples of the higher alcohol phosphoric acid esters include palmityl phosphoric acid ester, castor oil alkyl phosphoric acid esters, palm oil alkyl phosphoric acid esters, etc.

Among the anionic surfactants described above, surfactants having a sulfonic acid group are preferable; specifically, alkyl sulfonic acids, alkylbenzene sulfonic acids, olefin sulfonic acids, alkyl diphenyl ether disulfonic acids, alkyl naphthalene sulfonic acids, dialkyl sulfosuccinates, etc. may be exemplified. Among these, alkyl sulfonic acids, alkylbenzene sulfonic acids, alkyl diphenyl ether disulfonic acids, and dialkyl sulfosuccinates are preferable. Average carbon number of alkyl groups in the alkyl sulfonic acids is preferably 9 to 21, more preferably 12 to 18. Average carbon number of alkyl groups in the alkylbenzene sulfonic acids is preferably 6 to 18, more preferably 9 to 15. Average carbon number of alkyl groups in the alkyl diphenyl ether disulfonic acids is preferably 6 to 18, more preferably 9 to 15. Average carbon number of alkyl groups in the dialkyl sulfosuccinates is preferably 4 to 12, more preferably 6 to 10.

Among the anionic surfactants described above, alkyl sulfonic acids having an alkyl group of average carbon number 15 and alkylbenzene sulfonic acids having an alkyl group of average carbon number 12 are preferable.

The nonionic surfactants are exemplified by polyoxyethylene alkyl ethers, alkyne nonionic surfactants, etc. It is preferred that the nonionic surfactants are water-soluble. HLB is preferably in the range of 7 to 17. When HLB is lower and water-solubility is insufficient, the water-solubility may be imparted by mixing with other surfactants, for example.

In addition, one or combination of two or more of the surfactants may be added to the developing solution as the component (B2).

The content of the component (B2) in the developing solution is preferably 0.01% to 10% by mass. When the content of the component (B2) in the developing solution is 0.01% by mass or more, the deposition of the component (A) in the developing solution is effectively suppressed. The effect is pronounced when the developing solution is in the concentrated condition. Furthermore, when the content of the component (B2) is 10% by mass or less, the influence of the component (B2) on resist patterns such as dissolution and swelling can be reduced. The content of the component (B2) in the developing solution is more preferably 0.02% to 1% by mass and most preferably 0.03% to 0.5% by mass. In addition, the content of the component (B2) in this connection refers to the concentration in the developing solution in actual use for development processing rather than the concentration in the developing solution in the concentrated condition, as described above.

Clathrate Compound (B3)

The solubility of the component (A) in the developing solution can be increased and the deposition of the component (A) in the developing solution can be suppressed by adding the clathrate compound (component (B3)) as the component (B) to the developing solution. The effect is pronounced when the developing solution is in the concentrated condition.

The component (B3) is not particularly limited and may be conventional water-soluble clathrate compounds. Compounds forming the clathrate compound clathrate a hydrophobic compound etc. to dissolve in water. For this reason, the component (B3) clathrates the component (A) (TBAH) more hydrophobic than TMAH conventionally used in the developing solution and increases the solubility of the component (A) in the developing solution. Deposition of the component (A) can be suppressed by the action.

The clathrate compound is exemplified by cyclic oligosaccharides; among them, cyclodextrin is preferably exemplified. The cyclodextrin has a cylindrical configuration of distorted trapezoid (bucket shape) and introduces a guest compound (component (A)) into the cylindrical configuration to form the clathrate complex. The cyclodextrin includes $\alpha$-cyclodextrin, $\beta$-cyclodextrin, $\gamma$-cyclodextrin, and $\delta$-cyclodextrin. These cyclodextrins may be used alone or in combination of two or more. Crown ethers may also be used as the clathrate compound.

Other Components

A solvent component may be added to the developing solution of the present invention as the other components. Water is exemplified as the solvent component used for the developing solution of the present invention. It is preferred that the water used as the solvent component is highly-purified water such as deionized water and distilled water from the viewpoint of preventing decrease of yield ratio in producing semiconductor elements due to impurities like metal salts in the developing solution.

The content of halogens in the developing solution of the present invention is preferably 10 ppm or less, more preferably 1 ppm or less. Halogens are exemplified by bromine and chlorine. When the content of halogens is within the range, the yield ratio of produced semiconductors can be increased. Furthermore, the content of metal ions in the developing solution of the present invention is preferably 100 ppb or less, more preferably 10 ppb or less. When the content of metal ions is within the range, the yield ratio of produced semiconductors can be increased. Besides, the content of carbonate ion in the developing solution of the present invention is preferably 1% by mass or less, more preferably 0.1% by mass or less. When the content of carbonate ion is within the range, development property can be appropriately maintained.

Method of Preparing Developing Solution

The developing solution of the present invention is prepared by mixing the components described above. The method of mixing the components described above is not particularly limited. In addition, the developing solution of the present invention may be transported in a prepared condition at a predetermined concentration as a developing solution and directly used in a development step of photolithography processes, or may be prepared and transported in a concentrated condition and used in a development step of photolithography processes after diluting with a solvent component such as purified water. In the latter case, the component (A) is likely to deposit since the developing solution is in a concentrated condition during transportation. Therefore, the effect to prevent the deposition of the component (A) by the present invention is exerted.

In accordance with the developing solution for photolithography of the present invention, swelling of resist patterns can be suppressed during developing the selectively exposed resist films. Harmful results by swelled resist patterns particularly remarkably happen when the half pitch size in producing semiconductor elements is less than 50 nm, for example. Therefore, the developing solution of the present invention is favorably used when producing semiconductor elements having a half pitch size of less than 50 nm by a photolithography process. More specifically, the developing solution of the present invention is favorably used for producing semiconductor elements having a half pitch size of 49 nm or less.

The method for forming a resist pattern using the developing solution for photolithography of the present invention described above is one of the present inventions. The method for forming a resist pattern using the developing solution for photolithography of the present invention is explained in the following.

The method for forming a resist pattern using the developing solution for photolithography of the present invention may employ conventional methods for forming a resist pattern without particular limitations except that development is performed using the developing solution of the present invention. One exemplary method includes coating a negative or positive type photoresist composition on a surface of a substrate such as silicon wafer, selectively exposing with an active energy beam such as light and electron beams through a photo mask provided with a predetermined pattern, and performing a development processing.

When coating the photoresist composition on a surface of a substrate such as silicon wafer, conventional photoresist compositions may be used without particular limitations. The photoresist compositions are commercially easily available. Furthermore, when coating the photoresist composition on a surface of a substrate, conventional coating methods may be used without particular limitations. Methods using a spin coater are exemplified as the coating method.

The development processing may be performed by contacting the selectively exposed photoresist composition with the developing solution of the present invention. An exemplary processing is a process of immersing a substrate coated with the photoresist composition into the developing solution or a process of spraying the developing solution to the photoresist composition on a surface of a substrate. By way of the processing, alkali-soluble components in the selectively exposed photoresist composition are removed and a resist pattern is formed.

The behavior to swell resist patterns by the developing solution of the present invention is less than that by conventional developing solutions using TMAH. Therefore, the method for forming a resist pattern of the present invention can suppress problems such as turnover of patterns due to swelling of resist patterns even when forming fine patterns having a half pitch size of 49 nm or less.

Concentrated Developing Solution for Photolithography

As described above, by virtue of incorporating the component (B), the concentrated developing solution for photolithography can be prepared in which the deposition of TBAH of the component (A) is suppressed and transportation, storage, etc. can be stably performed even at normal temperature. The concentrated developing solution, i.e. that contains components (A) and (B) and has a concentration of the component (A) of 10% by mass or more, is also one of the present inventions. The concentration of the component (A) in the concentrated developing solution for photolithography is exemplified by 10% by mass or more, 20% by mass or more, 30% by mass or more, 40% by mass or more, etc. The concentrated developing solution for photolithography is already explained above; therefore, further explanation is omitted here.

The method for producing a developing solution for photolithography of the present invention is explained with respect to one embodiment in the following. The method for producing a developing solution for photolithography of this embodiment produces a developing solution for photolithography having a concentration suited to development by diluting a developing solution for photolithography in a concentrated condition. Initially, one example of an apparatus for producing a developing solution for photolithography used in the production method of this embodiment is explained with reference to FIG. 1. FIG. 1 is a schematic configuration view which shows an apparatus for producing a developing solution for photolithography used in one embodiment of the production method of the present invention.

The apparatus 1 for producing a developing solution for photolithography (hereinafter, sometimes referred to simply as "production apparatus 1") is used for producing a developing solution for photolithography containing TBAH of a second concentration less than a first concentration by mixing a tetrabutylammonium hydroxide (TBAH) aqueous solution of the first concentration of a concentrated developing solution with pure water.

The TBAH aqueous solution of the first concentration refers to a concentrated developing solution containing TBAH as an alkali component. The concentrated developing solution is usually shipped out from a manufacturer of developing solution. At least pure water and TBAH are included in the TBAH aqueous solution of the first concentration and various additives may be added thereto as required. Hereinafter, the TBAH aqueous solution of the first concentration is also referred to simply as "concentrated developing solution".

The developing solution for photolithography containing TBAH of the second concentration is an aqueous solution prepared by diluting the TBAH aqueous solution of the first concentration with pure water and is the developing solution used in photolithography processing. That is, the production apparatus 1 is an apparatus for preparing a developing solution used in photolithography processing by diluting the concentrated developing solution shipped out from a manufacturer of developing solution with pure water. Hereinafter, the developing solution containing TBAH at the second concentration is also referred to simply as "developing solution". The first and the second concentrations are explained later.

The production apparatus 1 includes a mixing part 2 for diluting the concentrated developing solution and a storage bath 3 for storing the developing solution prepared in the mixing part 2. The mixing part 2 is equipped with a stirring means 15, a first feed pipe 10 for feeding the concentrated developing solution to the mixing part 2, and a second feed pipe 14 for feeding pure water to the mixing part 2.

The concentrated developing solution produced by a manufacturer of developing solution is reserved in a transportable can 31. The transportable can 31 is connectable to a pipe 8 from a nitrogen gas feed source 6 with a joint 7 and connectable to a first feed pipe 10 toward the mixing part 2 with a joint 9. Here, another pipe 11 from the nitrogen gas feed source 6 is directed to a bubbling bath 12 and connected to upper portions of the mixing part 2 and the storage bath 3. Thereby, upper spaces of the mixing part 2 and the storage bath 3 form a moisture-containing nitrogen atmosphere. Pure water is fed to the bubbling bath 12 from a water feed source 5 to maintain a water height of the bubbling bath 12 at a predetermined position.

A sub tank 26, a filter device 13, an air valve 27, and a first warming means 51 are provided in series along the first feed pipe 10 to the mixing part 2. The sub tank 26 is provided with a liquid level sensor to detect when one of the transportable cans becomes empty. Thereby, when one of the transportable cans becomes empty, another can promptly follows and the concentrated developing solution is continuously fed to the first feed pipe 10. The air valve 27 is a high-flow air valve and a fine control air valve 28 is provided on the bypass. Thereby, when the concentrated developing solution is poured into the mixing part 2, the concentrated developing solution can be correctly poured into the mixing part 2 in a way that the air valve 27 is used until near a predetermined amount and then the air valve 28 is used.

The first warming means 51 warms the concentrated developing solution so that the concentrated developing solution becomes 27° C. or higher when the concentrated developing solution fed from the first feed pipe 10 is fed to the mixing part 2. The first warming means 51 is equipped with a warming means such as heater and may be further equipped with a temperature monitor for monitoring the temperature of the warmed concentrated developing solution. In this case, the temperature information of the concentrated developing solution detected by the temperature monitor may be fed back to adjust output of the warming means. The warming means may be one of conventional warming means without particular limitations; and an electric heater may be exemplified. The temperature of the concentrated developing solution when being fed to the mixing part 2 is not particularly limited as long as the temperature is 27° C. or higher; the temperature is preferably adjusted to 27° C. to 40° C., more preferably 28° C. to 35° C.

The second feed pipe 14 feeds pure water from the pure water feed source 5 to the mixing part 2. An air valve 29 and a second warming means 52 are provided in series along the second feed pipe 14. The air valve 29 is a high-flow air valve and a fine control air valve 30 is provided on the bypass. Thereby, when the pure water is poured into the mixing part 2, the pure water can be correctly poured into the mixing part 2 in a way that the air valve 30 is used until near a predetermined amount and then the air valve 29 is used.

The second warming means 52 warms the pure water in a way that the pure water becomes 27° C. or higher when the pure water fed from the second feed pipe 14 is fed to the mixing part 2. The second warming means 52 is equipped with a warming means such as heater and may be further equipped with a temperature monitor for monitoring the temperature of the warmed pure water. In this case, the temperature information of the pure water detected by the temperature monitor may be fed back to adjust output of the warming means. The warming means may be one of conventional warming means without particular limitations; and an electric heater may be exemplified. The temperature of the pure water when being fed to the mixing part 2 is not particularly limited as long as the temperature is 27° C. or higher; the temperature is preferably adjusted to 27° C. to 40° C., more preferably 28° C. to 35° C.

The mixing part 2 is provided with a temperature control means 40 consisting of a temperature sensor 41, a heater 42, and a temperature regulator 43. The temperature control means 40 maintains the temperature of liquid contained in the mixing part 2 at 27° C. or higher. Specifically, the temperature of liquid contained in the mixing part 2 is detected as temperature information by the temperature sensor 41 and the temperature information is sent to the temperature regulator 43. Then the temperature regulator 43 adjusts output of the heater 42 so that the temperature of liquid contained in the mixing part 2 is 27° C. or higher (e.g., 30° C.). Thereby, the temperature of liquid contained in the mixing part 2 is maintained at a temperature of 27° C. or higher previously set at the temperature regulator 43. The temperature of liquid contained in the mixing part 2 is not particularly limited as long as the temperature is 27° C. or higher; the temperature is preferably adjusted to 27° C. to 40° C., more preferably 28° C. to 35° C.

The concentrated developing solution and the pure water fed from the first and the second feed pipes 10, 14 to the mixing part 2 are uniformly stirred by the stirring means 15 to prepare the developing solution.

The mixing part 2 is supported by a load cell 16 and a total mass of the mixing part 2 containing the concentrated developing solution and the pure water fed therein is measured by the load cell 16.

The mixing part 2 and the storage bath 3 are connected by a feed pipe 17 of the developing solution. A pump 18 and a filter device 19 are provided along the pipe 17, and a pipe 20 to an automatic analyzer 4 is branched from downstream of the filter device 19. Furthermore, the automatic analyzer 4 and the mixing part 2 are connected by a return pipe 21. In addition, on-off valves 22, 23 are provided downstream of the branched portion of the pipe 17 and at a portion connecting the pipe 17 and the pipe 21.

Upper spaces of the mixing part 2, the bubbling bath 12, and the storage bath 3 are connected by a communication pipe 24 to form a moisture-containing nitrogen atmosphere. Thereby, degradation of the developing solution is prevented. Furthermore, a pipe 25 for feeding the developing solution to a use portion extends from a bottom of the storage bath 3.

The method for producing a developing solution for photolithography of this embodiment is explained in the following.

Initially, the tetrabutylammonium hydroxide aqueous solution of the first concentration (concentrated developing solution) contained in the transportable can 31 is fed to the mixing part 2 through the first feed pipe 10. At this time, the concentrated developing solution is warmed by the first warming means 51 provided on the first feed pipe 10 and the temperature is adjusted to 27° C. or higher when it is fed to the mixing part 2. The concentrated developing solution fed to the mixing part 2 is kept warm at a temperature of 27° C. or higher by the temperature control means 40 provided in the mixing part 2. The temperatures of the concentrated developing solution when being fed to the mixing part 2 and being contained in the mixing part are already described above.

Then the pure water is fed to the mixing part 2 from the pure water feed source 5 through the second feed pipe 14. At this time, the pure water is warmed by the second warming means 52 provided on the second feed pipe 14 and the temperature is adjusted to 27° C. or higher when it is fed to the mixing part 2. The concentrated developing solution and the pure water fed to the mixing part 2 are kept warm at a temperature of 27° C. or higher by the temperature control means 40 provided in the mixing part 2. The preferable temperature of the pure water when being fed to the mixing part 2 is already described above.

Figure 2:
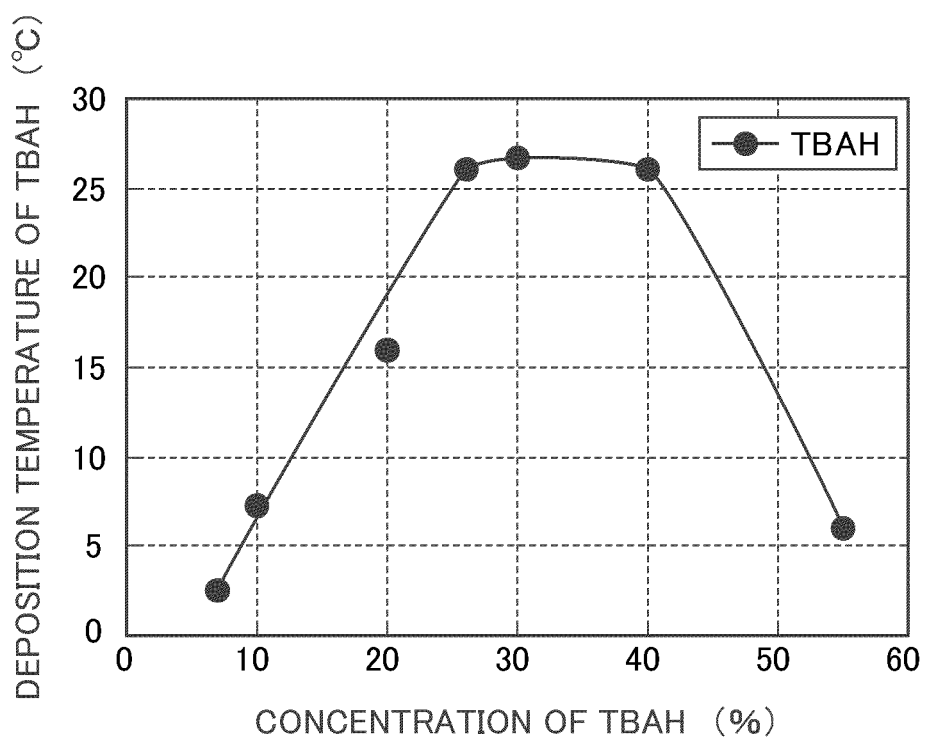
FIG. 2 is a graph which plots a relation between concentration and deposition temperature of tetrabutylammonium hydroxide (TBAH) in a TBAH aqueous solution.

Here, the reason why the temperatures of the concentrated developing solution, the pure water fed to the mixing part 2, and the liquid existing in the mixing part 2 are adjusted to 27° C. or higher is explained with reference to FIG. 2. FIG. 2 is a graph which plots a relation between concentration and deposition temperature of tetrabutylammonium hydroxide (TBAH) in a TBAH aqueous solution.

As shown in FIG. 2, the maximum deposition temperature is observed at a TBAH concentration of 30% by mass, in a plot showing the relation between the concentration of TBAH in an aqueous solution as represented on the x-axis and deposition temperature of TBAH as represented on the y-axis. Here, the deposition temperature of TBAH means the temperature at which TBAH crystals begin to deposit in a TBAH aqueous solution. That is, the deposition temperature of TBAH indicates the temperature level of cooled TBAH aqueous solution at which TBAH deposition starts. Therefore, a higher deposition temperature of TBAH indicates that TBAH is more likely to deposit.

From this viewpoint, it is understood from FIG. 2 that the TBAH aqueous solution represents a condition at 30% by mass where TBAH crystals are most likely to deposit. Here, the situation is envisaged where a TBAH aqueous solution at the first concentration of the concentrated developing solution is diluted with pure water to a TBAH aqueous solution at the second concentration used as the developing solution. The developing solution containing TBAH is typically a TBAH aqueous solution of 6.79% by mass although depending on the developing condition and the concentrated developing solution is typically a TBAH aqueous solution of 50% by mass or more. Therefore, the condition certainly passes through where TBAH is most likely to deposit while being diluted from the first concentration of 50% by mass to the second concentration of 6.79% by mass. That is, as shown in FIG. 2, if the temperature of the developing solution is below 27° C. during dilution, the deposition of TBAH occurs when the concentration of the developing solution during dilution reaches near 30% by mass. Conversely, if the temperature of the developing solution can be maintained at 27° C. or higher during dilution, the deposition of TBAH can be suppressed. The concentrated developing solution can be diluted without the deposition of TBAH by employing the production method described above even if such a condition passes where the concentration comes to 30% by mass at which TBAH is most likely to deposit, that is, even if the condition is such that the concentration of concentrated developing solution (first concentration) is above 30% by mass and the concentration of developing solution (second concentration) is 30% by mass or less.

The first concentration is preferably above 30% by mass to 80% by mass or less, more preferably 40% to 70% by mass, and most preferably 50% to 60% by mass.

Furthermore, the second concentration is preferably 0.1% to 20% by mass, more preferably 1% to 10% by mass, still more preferably 5% to 8% by mass, and most preferably 6.79% by mass. The second concentration of 0.1% by mass or more can provide the developing solution with proper development ability and the second concentration of 20% by mass or less can suppress the resist patterns solved by the developing solution and proper development margin can be maintained.

In order to maintain the temperature of the developing solution at 27° C. or higher during dilution, at least the concentrated developing solution (TBAH aqueous solution of the first concentration) and the pure water fed to the mixing part 2 are adjusted to 27° C. or higher and the temperature of the liquid contained in the mixing part 2 is maintained at 27° C. or higher. From this reason, the concentrated developing solution and the pure water fed to the mixing part 2 are adjusted to 27° C. or higher and the temperature of the liquid contained in the mixing part 2 is maintained at 27° C. or higher in the production method of this embodiment, as described above.

The method of arranging the concentration of the concentrated developing solution to be diluted in the mixing part 2 into the second concentration of the desired concentration of the developing solution is explained in the following.

As explained already, initially, the concentrated developing solution and the pure water are fed into the mixing part 2; on this occasion, the feed amounts of the both are approximately tied to a desired dilution ratio. In this connection, the dilution ratio is the ratio of (first concentration)/(second concentration).

Then the concentrated developing solution and the pure water existing in the mixing part 2 are uniformly mixed by the stirring means 15 and a part of the mixture liquid is sent to the automatic analyzer 4. In order to send a part of the mixture liquid to the automatic analyzer 4, the valves 22, 23 are closed. Thereby, a part of the mixture liquid is sent to the automatic analyzer 4 through the pipes 17, 20 and the filter device 19. At this time, insoluble matters in the mixture liquid are removed by the filter device 19. In addition, it is convenient for removing the insoluble matters existing in the mixing part 2 to open the valve 23 when inside of the mixing part 2 is mixed.

The automatic analyzer 4 measures a concentration of TBAH in the mixture liquid (diluted concentrated developing solution). Various chemical or physical methods may be employed as the measurement method.

In this way, the automatic analyzer 4 analyzes the concentration of TBAH in the mixture liquid and calculates a mass of the concentrated developing solution or the pure water to be added to the mixing part 2 for preparing the TBAH aqueous solution (developing solution) of the second concentration based on the analysis value. Then one of the concentrated developing solution and the pure water to be added is fed again into the mixing part 2 based on the calculated value. Whether or not a predetermined amount of the concentrated developing solution or the pure water has been added is judged by measuring the mass of the mixing part 2 by the load cell 16. In addition, the concentrated developing solution or the pure water added to the mixing part 2 is warmed to 27° C. or higher when being fed to the mixing part by the first warming means 51 or the second warming means 52, as described already.

When the mass of the mixing part 2 measured by the load cell 16 has increased by the mass calculated as described above, the feed of the concentrated developing solution or the pure water to the mixing part 2 is stopped, then the concentrated developing solution and the pure water in the mixing part 2 are uniformly mixed again by the stirring means 15, and a part of the mixture liquid is similarly sent to the automatic analyzer 4 to confirm that the concentration of TBAH in the mixture liquid coincides with the second concentration. After the concentration of TBAH in the mixture liquid has coincided with the second concentration, the valve 22 is opened, and the developing solution having the second concentration of TBAH is transported to the storage bath 3 through the pipe 17, thereby completing the production of the developing solution.

In addition, TBAH may deposit even in the concentrated developing solution or at the concentration of the produced developing solution depending on environmental temperatures, as shown in FIG. 2. It is therefore preferred that a temperature control means is appropriately provided at the sites where the concentrated developing solution or the developing solution is passed or stored.

The developing solution for photolithography produced by the method for producing a developing solution for photolithography described above and the method for forming a resist pattern using the developing solution are also one of the present inventions. The developing solution for photolithography and the method for forming a resist pattern using the developing solution are similar as those already explained, thus further explanations are omitted here.

In the above descriptions, the method and the apparatus for producing a developing solution for photolithography are explained with reference to one embodiment; however, the present invention is not limited to the embodiment described above and may be carried out with appropriately making a change within the scope of the present invention.

For example, the concentrated developing solution is warmed by the first warming means 51 provided on the first feed pipe 10 in the embodiment described above, but the concentrated developing solution may be warmed by a warming means provided at the transportable can 31, the sub tank 26, etc. It is preferred in this case that a temperature control means is appropriately provided at the first feed pipe 10 etc. so that the temperature of the concentrated developing solution is maintained at 27° C. or higher when having been fed to the mixing part 2. A system for monitoring existence or nonexistence of TBAH deposition may also be provided by disposing a turbidity meter etc. at the mixing part 2, the storage bath 3, the feed pipes, etc. Besides, an ultrasonic device etc. may be provided in the mixing part 2, and also a stirring means, an ultrasonic device, etc. may be provided in the storage bath 3 in order to further suppress the deposition of TBAH.

Furthermore, the pure water is warmed by the second warming means 52 provided on the second feed pipe 14 in the embodiment described above, but the pure water may be warmed when being fed from the pure water feed source. It is preferred in this case that a temperature control means is appropriately provided at the second feed pipe 14 etc. so that the temperature of the pure water is maintained at 27° C. or higher when having been fed to the mixing part 2.

Furthermore, the concentrated developing solution and the pure water are mixed in the mixing part 2 having a tank shape in the embodiment described above, but they may be mixed by other means. For example, a pipe flowing the concentrated developing solution and a pipe flowing the pure water may be joined together to mix in the water flow. In this case, a stirring means is provided downstream of the joining in order to uniformly mix the water flow. In addition, the stirring means in this case is not limited to rotating bodies, for example, but may be a static body etc. such as a protrusion provided inside a pipe in order to disturb the water flow.

Furthermore, the developing solution is transported and stored in the storage bath 3 after being prepared in the embodiment described above, but may be stored in a container such as drum cans.

Furthermore, additives such as water-soluble organic solvents, surfactants, and clathrate compounds may be added in the mixing part 2. The deposition temperature of TBAH can be lowered and the deposition of TBAH can be further suppressed by adding these additives. These additives and their additive amounts are explained already, thus further explanations are omitted here.

EXAMPLES

The developing solution for photolithography of the present invention is more specifically explained with respect to Examples in the following, but the present invention should nevertheless not be limited to Examples below.
TBAH Deposition Preventing Effect by Adding Water-Soluble Organic Solvent
Preparation of Developing Solution Developing solutions of Examples 1 to 5 were respectively prepared by dissolving tetrabutylammonium hydroxide (TBAH) and isopropanol (IPA) as a water-soluble organic solvent into purified water (deionized water) in the concentrations shown in Table 1. The numerical values shown in Table 1 are expressed in terms of % by mass. Furthermore, a developing solution of Comparative Example 1 was prepared by dissolving only tetrabutylammonium hydroxide (TBAH) into deionized water in the concentration shown in Table 1. Besides, a developing solution of Comparative Example 2 was prepared by dissolving only tetramethylammonium hydroxide (TMAH) into deionized water in the concentration shown in Table 1. In addition, the TBAH aqueous solution of 6.79% by mass and the TMAH aqueous solution of 2.38% by mass are the same in term of mole concentration. TMAH aqueous solution of 2.38% by mass is typically used as production processes of semiconductor elements and is the same as the developing solution of Comparative Example 2.

Furthermore, developing solutions of Examples 6 to 15 were prepared by dissolving tetrabutylammonium hydroxide (TBAH), and ethylene glycol (EG), propylene glycol (PG), or glycerin of polyhydric alcohols as the water-soluble organic solvent in the concentrations respectively shown in Table 2 into deionized water. The numerical values shown in Table 2 are expressed in terms of % by mass.
Evaluation of Swelling of Resist Pattern Swelling was observed and evaluated using a QCM (Quartz Crystal Microbalance) measurement. ARF resist TArF-TAI-6144 ME (manufactured by Tokyo Ohka Kogyo Co., Ltd.) was coated on a quartz crystal substrate of one inch by a spin coater and subjected to PAB at 100° C. for 1 minute to form a resist film of 136 nm thick. The substrate was exposed to 3 mJ/cm$^2$ using VUVES-4500 (manufactured by Litho Tech Japan Co.) and subjected to PEB at 100° C. for 1 minute.

The substrate after PEB was evaluated with respect to a swelling amount using QCM meter RDA-Qz3 (manufactured by Litho Tech Japan Co.) of the developing solutions.

The swelling degree was measured by the time until which an impedance value obtained by QCM measurement saturates. The longer the time for saturation of an impedance value, the larger the swelling amount, and the shorter the time, the smaller the swelling amount.

The evaluation criteria are shown below, and the evaluation results are shown in Tables 1 and 2.

A: saturation occurs by ½ or less of the time it takes for saturation of impedance to occur using TMAH 2.38% as the reference for development, and swelling of resist is remarkably less than that when TMAH is employed;

B: saturation occurs in less time than the time it takes for saturation of impedance to occur using TMAH 2.38% as the reference for development, and swelling of resist is less than that when TMAH is employed; and C: saturation occurs in the same or longer than the time it takes for saturation of impedance to occur using TMAH 2.38% as the reference for development, and swelling of resist is similar or larger than that when TMAH is employed.

Deposition Evaluation

The TBAH aqueous solution is most likely to deposit at a concentration near 30% by mass. Therefore, developing solutions of Examples 1 to 15 and Comparative Examples 1 to 2 were concentrated to prepare concentrated developing solutions having a concentration of TBAH or TMAH of 30% by mass, then which were gradually cooled to measure a temperature at which TBAH or TMAH deposits. That is, the deposition of TBAH was evaluated for the aqueous solution of 30% by mass of TBAH and 4.4% by mass of IPA in Example 1. Similarly, the deposition was evaluated for 30% by mass of TBAH and 13.3% by mass of IPA in Example 2, 30% by mass of TBAH and 22.1% by mass of IPA in Example 3, 30% by mass of TBAH and 30.9% by mass of IPA in Example 4, 30% by mass of TBAH and 44.2% by mass of IPA in Example 5, 30% by mass of TBAH and 13.3% by mass of EG in Example 6, 30% by mass of TBAH and 22.1% by mass of EG in Example 7, 30% by mass of TBAH and 13.3% by mass of PG in Example 8, 30% by mass of TBAH and 22.2% by mass of PG in Example 9, 30% by mass of TBAH and 30.9% by mass of PG in Example 10, 30% by mass of TBAH and 44.2% by mass of PG in Example 11, 30% by mass of TBAH and 13.3% by mass of GC in Example 12, 30% by mass of TBAH and 22.1% by mass of GC in Example 13, 30% by mass of TBAH and 30.9% by mass of GC in Example 14, 30% by mass of TBAH and 44.2% by mass of GC in Example 15, 30% by mass of TBAH in Comparative Example 1, and 30% by mass of TMAH in Comparative Example 2. In addition, existence or nonexistence of TMAH deposition was evaluated in Comparative Example 2. The evaluation criteria are shown below, and the evaluation results are shown in Tables 1 and 2. Lower deposition temperature in this evaluation means that the possibility to maintain a dissolved condition is higher even in an aqueous solution (concentrated developing solution) at lower temperatures and that the deposition is more unlikely to occur.

AAA: deposition temperature is lower than 5° C.;
AA: deposition temperature is 5° C. or higher and lower than 10° C.;
A: deposition temperature is 10° C. or higher and lower than 15° C.;
B: deposition temperature is 15° C. or higher and lower than 20° C.;
C: deposition temperature is 20° C. or higher and lower than 23° C.; and
D: deposition temperature is 23° C. or higher.

Evaluation of Deposition Property of Various Concentrated Developing Solution

In the deposition evaluation described above, TBAH deposition was evaluated for concentrated developing solutions (30% by mass of TBAH concentration) which are more concentrated than the developing solution having a TBAH concentration (6.79% by mass) envisaged in usual production processes of semiconductor elements. Developing solutions as finished products are usually transported or stored in a concentrated condition in order to reduce the cost of transportation, storage, etc.; therefore, the deposition evaluation described above corresponds to such a manner of transportation, storage, etc. However, the concentration of developing solutions during transportation, storage, etc. of developing solutions vary in actual use. Therefore, two to more developing solutions having different concentrated levels were prepared with respect to the developing solution of Examples 8, 12, 13 and Comparative Example 1, and deposition evaluation was performed for these concentrated developing solutions. In this evaluation, the concentration of TBAH in developing solutions as finished products was set to be 6.79% by mass, and concentrated developing solutions having a TBAH concentration of 10%, 20%, 30%, or 40% by mass were respectively prepared (10%, 20%, or 30% by mass in concentrated developing solutions of Example 13), and deposition property of the concentrated developing solutions was evaluated. The results are shown in Tables 3 and 4. In addition, the evaluation criteria in the column "Deposition Evaluation" in Tables 3 and 4 are similar as those of "Deposition Evaluation" described above. In Tables 3 and 4, the concentrated developing solutions containing a component concentration shown in the column "Concentration at Evaluation" were subjected to the deposition evaluation, and the column "Concentration at Finished Product" is no more than for reference which indicates a component concentration of non-concentrated developing solutions (i.e., developing solutions prepared from concentrated developing solutions).

TABLE 1

|  | Example | | | | | Comparative Example | |
|---|---|---|---|---|---|---|---|
|  | 1 | 2 | 3 | 4 | 5 | 1 | 2 |
| TBAH | 6.79 | 6.79 | 6.79 | 6.79 | 6.79 | 6.79 | — |
| TMAH | — | — | — | — | — | — | 2.38 |
| IPA | 1 | 3 | 5 | 7 | 10 | — | — |
| Pure Water | 92.21 | 90.21 | 88.21 | 86.21 | 83.21 | 93.21 | 97.62 |
| Total | 100 | 100 | 100 | 100 | 100 | 100 | 100 |
| Swelling Evaluation | A | A | A | A | B | A | C |
| Deposition Evaluation | C | B | B | A | AA | D | AAA |

TABLE 2

|  | Example | | | | | | | | | |
|---|---|---|---|---|---|---|---|---|---|---|
|  | 6 | 7 | 8 | 9 | 10 | 11 | 12 | 13 | 14 | 15 |
| TBAH | 6.79 | 6.79 | 6.79 | 6.79 | 6.79 | 6.79 | 6.79 | 6.79 | 6.79 | 6.79 |
| EG | 3 | 5 | — | — | — | — | — | — | — | — |

TABLE 2-continued

|  | Example | | | | | | | | | |
|---|---|---|---|---|---|---|---|---|---|---|
|  | 6 | 7 | 8 | 9 | 10 | 11 | 12 | 13 | 14 | 15 |
| PG | — | — | 3 | 5 | 7 | 10 | — | — | — | — |
| GC | — | — | — | — | — | — | 3 | 5 | 7 | 10 |
| Pure Water | 90.21 | 88.21 | 90.21 | 88.21 | 86.21 | 83.21 | 90.21 | 88.21 | 86.21 | 83.21 |
| Total | 100 | 100 | 100 | 100 | 100 | 100 | 100 | 100 | 100 | 100 |
| Swelling Evaluation | A | A | A | A | A | A | A | A | A | A |
| Deposition Evaluation | B | A | B | A | AA | AAA | A | AA | AA | AAA |

TABLE 3

|  |  | Example 8 | | | | Example 12 | | | | Example 13 | | |
|---|---|---|---|---|---|---|---|---|---|---|---|---|
| TBAH % by mass | Concentration at Finished Product | 6.79 | | | | 6.79 | | | | 6.79 | | |
|  | Concentration at Evaluation | 10 | 20 | 30 | 40 | 10 | 20 | 30 | 40 | 10 | 20 | 30 |
| PG % by mass | Concentration at Finished Product | 3 | | | | | | | | | | |
|  | Concentration at Evaluation | 4.4 | 8.8 | 13.3 | 17.7 | | | | | | | |
| GC % by mass | Concentration at Finished Product | | | | | 3 | | | | 5 | | |
|  | Concentration at Evaluation | | | | | 4.4 | 8.8 | 13.3 | 17.7 | 7.4 | 14.7 | 22.1 |
| Deposition Evaluation | | AA | A | B | B | AA | A | A | A | AAA | AA | AA |

TABLE 4

|  |  | Comparative Example 1 | | | |
|---|---|---|---|---|---|
| TBAH % by mass | Concentration at Finished Product | 6.79 | | | |
|  | Concentration at Evaluation | 10 | 20 | 30 | 40 |
| PG % by mass | Concentration at Finished Product | | | | |
|  | Concentration at Evaluation | | | | |
| GC % by mass | Concentration at Finished Product | | | | |
|  | Concentration at Evaluation | | | | |
| Deposition Evaluation | | AA | B | D | D |

It is realized that TBAH deposition in concentrated conditions is suppressed by adding water-soluble organic solvents to developing solutions from the comparison between Examples 1 to 15 and Comparative Example 1 as shown in Tables 1 and 2. It is also realized that damage to resist films (resist patterns) due to water-soluble organic solvents added to developing solutions are suppressed when the concentrations of the water-soluble organic solvents added to developing solutions are within a range of 3% to 7% by mass from the comparison between Examples 2 to 4 and Examples 1, 5. It is also understood that the use of polyhydric alcohols particularly provides a well balance between the swelling suppression effect on resist films and the TBAH deposition suppression effect when alcohol is used as the water-soluble organic solvent added to the developing solution from the comparison between the developing solutions of Examples 1 to 5 and the developing solutions of Examples 6 to 15. It is then understood that the tendency is more significant when trivalent alcohols are used than when divalent alcohols are used among polyhydric alcohols. In addition, the developing solution of Comparative Example 2, which uses TMAH rather than TBAH in order to impart alkalinity to the developing solution, resulted in remarkably large swelling of the resist film.

Furthermore, there appears a tendency as shown in Table 3 that TBAH in concentrated developing solutions is likely to deposit when the concentration degree in concentrated developing solutions increases and the concentration of TBAH increases; however, the deposition suppression effect could be derived to a level problem-free in actual use even for concentrated developing solutions having a TBAH concentration of about 40% by mass by adding PG (propylene glycol) or GC (glycerin) to the concentrated developing solutions. It is then understood that the deposition suppression effect is particularly significant in GC rather than PG. In contrast, TBAH becomes likely to deposit in particular when the concentration degree in concentrated developing solutions increases and the concentration of TBAH increases with respect to the concentrated developing solutions containing no water-soluble organic solvent such as PG and GC as shown in Table 4 and the deposition temperature is 23° C. or higher with respect to the concentrated developing solutions having a TBAH concentration of 30% by mass or higher. It is understood from this result that the concentrated developing solutions containing no water-soluble organic solvent such as PG and GC are difficult for transportation, storage, etc. at normal temperature and necessary for an appropriate treatment such as warming during transportation.

From the results described above, it is understood that the present invention is effective to suppress deposition in developing solutions containing TBAH and particularly effective to suppress deposition in developing solutions having a TBAH concentration of 10% by mass or higher, 20% by mass or higher, 30% by mass or higher, or 40% by mass or higher.

What is claimed is:

1. A concentrated developing solution for photolithography, comprising tetrabutylammonium hydroxide (A), a water-soluble organic solvent (B1), and water, wherein the concentration of the tetrabutylammonium hydroxide (A) is 20% to 50% by mass and the component (B1) is a polyhydric alcohol, and wherein a halogen content is 10 ppm or less and a metal ion content is 100 ppb or less.

2. The concentrated developing solution for photolithography according to claim 1, wherein the developing solution is diluted by adding a solvent when used as a developing solution so that the concentration of the tetrabutylammonium hydroxide (A) is 1% to 10% by mass.

3. The concentrated developing solution for photolithography according to claim 2, wherein the concentration of the component (B1) is 1 to 10% by mass when the concentrated developing solution is diluted by adding a solvent so that the concentration of the tetrabutylammonium hydroxide (A) is 1% to 10% by mass.

4. The concentrated developing solution for photolithography according to any one of claims 1 to 3, wherein the polyhydric alcohol is at least one selected from the group consisting of ethylene glycol, propylene glycol, and glycerin.

5. The concentrated developing solution for photolithography according to claim 1, wherein the solution is used in producing a semiconductor element having a half pitch size of 49 nm or less.

6. The concentrated developing solution for photolithography according to claim 2, wherein the solution is used in producing a semiconductor element having a half pitch size of 49 nm or less.

7. The concentrated developing solution for photolithography according to claim 3, wherein the solution is used in producing a semiconductor element having a half pitch size of 49 nm or less.

* * * * *